(12) United States Patent
Geyer et al.

(10) Patent No.: US 6,250,141 B1
(45) Date of Patent: Jun. 26, 2001

(54) SCANNING DEVICE

(75) Inventors: Stefan Geyer, Dresden; Michael Horn, Ottobrunn; Rüdiger Hunger, Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/436,600

(22) Filed: Nov. 9, 1999

(30) Foreign Application Priority Data

Nov. 9, 1998 (DE) .............................................. 198 51 599

(51) Int. Cl.$^7$ ...................................................... G01N 19/02
(52) U.S. Cl. .............................................. 73/104; 73/61.71
(58) Field of Search .................................. 73/104, 61.42, 73/61.71, 64.48, 64.52; 216/59, 84

(56) References Cited

U.S. PATENT DOCUMENTS 3,731,529 * 5/1973 Pepmeier et al. ....................... 73/104
6,005,400 * 12/1999 Thundat et al. ....................... 324/752

* cited by examiner

*Primary Examiner*—Hezron Williams
*Assistant Examiner*—Michael Cygan
(74) *Attorney, Agent, or Firm*—Herbert L. Lerner; Laurence A. Greenberg; Werner H. Stemer

(57) ABSTRACT

A scanning device for semiconductor wafers with which rapid and dependable scanning is permitted. The invention is characterized by a base plate with a guiding pin protruding from it for the manual guidance of a depositing plate which is displaceable on the latter. The depositing plate is intended to receive a semiconductor wafer and is provided on an underside with meandering guiding channels for guiding by the guiding pin. A liquid drop is kept on a surface of the semiconductor wafer by a scanning tube and collects metal and dopant traces from the semiconductor wafer. The liquid drop can then be analyzed for determining a purity of the surface of the semiconductor wafer.

11 Claims, 2 Drawing Sheets

SCANNING DEVICE

BACKGROUND OF THE INVENTION

Field of the Invention

The invention concerns a scanning device for semiconductor wafers for the preparation of a surface analysis in which a liquid drop is moved over the surface of the semiconductor wafer for determining a concentration of metal and dopant traces in the liquid drop.

Such scanning devices are used to collect metal and dopant traces from the surface of the semiconductor wafer and ascertain the purity of the surface of the semiconductor wafer. On the basis of the result of the analysis, the preceding processing steps can then be assessed.

In preparation for scanning, the semiconductor wafer is firstly treated in a gas-phase treatment chamber, a so-called vapor phase decomposition (VPD) box with a hydrogen fluoride gas. The semiconductor wafer is subsequently removed from the VPD box and a liquid drop is placed on the now hydrophobic surface of the semiconductor wafer. The semiconductor wafer itself is held manually with the aid of a suction pipette. The liquid drop is then rolled over the surface of the semiconductor wafer by carefully tilting the latter. As this occurs, metal and dopant traces are collected from the surface of the semiconductor wafer and concentrated in the liquid drop.

While the treatment step in the VPD box necessary before scanning the semiconductor wafer is to be regarded as a very simple and reliable process, scanning the semiconductor wafer manually requires considerable dexterity and practice. At the same time, the liquid drop must be prevented from rolling off the semiconductor wafer, which would make an analysis impossible. In addition, when scanning the semiconductor wafer, it must be ensured that all the regions of the surface of the semiconductor wafer are covered.

In the case of relatively small semiconductor wafers, this freehand scanning is to be regarded as an entirely customary practice. However, in the case of semiconductor wafers with a diameter of 300 mm, this freehand scanning becomes extremely difficult or impossible.

Therefore, for the scanning of such semiconductor wafers, devices that carry out both the VPD treatment and the scanning of the surface of the semiconductor wafers fully automatically have been developed. Such devices are, however, extremely cost-intensive and unsatisfactory in their reliability. This applies in particular to the scanning of semiconductor wafers that are difficult to scan, such as semiconductor wafers with LPCVD nitride layers.

Furthermore, it may happen that, during scanning, parts of the liquid drop remain on the surface of the semiconductor wafer, in other words are lost. These lost amounts of liquid can be collected again when scanning manually, whereas this recollection is not possible in the case of fully automatic devices.

SUMMARY OF THE INVENTION

It is accordingly an object of the invention to provide a scanning device which overcomes the above-mentioned disadvantages of the prior art devices of this general type, which permits rapid and dependable scanning and can be produced with little effort and low costs.

With the foregoing and other objects in view there is provided, in accordance with the invention, a scanning device for performing part of a surface analysis of semiconductor wafers, including: a base plate; a depositing plate resting displacably on the base plate, the depositing plate provided for receiving a semiconductor wafer having a surface; and a receptacle disposed on the base plate from which a liquid drop is positionable on the surface of the semiconductor wafer and the semiconductor wafer and the liquid drop are movable in relation to each other so that a concentration of metal and dopant traces from the semiconductor wafer are trapped in the liquid drop.

The object on which the invention is based is achieved by providing a depositing plate which can be displaced on a base plate and is intended for receiving the semiconductor wafer, by the liquid drop being positionable on the surface of the semiconductor wafer in a receptacle and by the semiconductor wafer and the liquid drop being movable in relation to each other.

With the scanning device, which is particularly simple and therefore able to be produced at low cost and is suitable for semiconductor wafers of any size, a considerable improvement in the operation of scanning semiconductor wafers is achieved.

In particular, the liquid drop can now be guided in a specifically directed manner over the surface of the semiconductor wafer, with the result that the scanning operation is considerably facilitated.

The semiconductor wafer is preferably aligned horizontally on the depositing plate, the receptacle for the liquid drop being configured as a scanning tube that is positioned directly over the surface of the semiconductor wafer.

To allow the liquid drop to be guided dependably, the scanning tube is produced from a plastic with hydrophobic properties.

A further continuation of the invention is characterized in that the scanning tube is fastened on an extension arm that is securely connected to the base plate. The extension arm reaches over the depositing plate with the semiconductor wafer resting on it, with the result that the depositing plate can be displaced under the scanning tube. The distance of the extension arm from the base plate is chosen such that, when the depositing plate is pushed in, the scanning tube does not touch the surface of the semiconductor wafer lying on the depositing plate. The liquid drop located on the scanning tube can then be guided over the surface of the semiconductor wafer.

In a further development of the invention, the semiconductor wafer can be moved in a horizontal direction in a meandering or spiral-shaped manner with respect to the liquid drop held in the scanning tube, with the result that the entire surface of the semiconductor wafer can be scanned.

To allow this to be carried out particularly simply and rapidly, a further development of the invention is characterized in that the depositing plate is provided on its lower side, remote from the semiconductor wafer, with a meandering or spiral-shaped guide corresponding to the intended path of movement of the liquid drop on the surface of the semiconductor wafer, for receiving a stationary guiding element.

The guide in this case extends over a surface area on the depositing plate that corresponds at least to the surface to be patterned of the semiconductor wafer.

In a further development of the invention, the guide is configured as a channel or groove, into which the guiding element enters in the form of a guiding pin protruding from the base plate, the guiding pin being in alignment with the scanning tube.

The object on which the invention is based is also achieved by a base plate with a guiding pin protruding from it for the manual guidance of a depositing plate which rests displaceably on the base plate. The depositing plate is intended for receiving and holding a semiconductor wafer and is provided on its underside with guiding channels for the guiding pin. With the use of a liquid drop which can be positioned on the surface of the semiconductor wafer and by a scanning tube for holding and guiding the liquid drop resting on the surface of the semiconductor wafer, the concentration of metals and dopant traces can be determined. The scanning tube is fixed in place, positioned over the semiconductor wafer that is displaceable in a meandering or spiral-shaped manner and/or rotatable, or is displaceable with respect to the semiconductor wafer.

To be regarded as particular a advantage of the scanning device according to the invention is that even unpracticed beginners without particular dexterity are able to scan semiconductor wafers. The scanning speed is freely variable and can consequently be adapted individually. In addition, it is possible without any problems to re-collect a lost liquid drop by simply scanning backward.

To be regarded as a further advantage of the invention is that it is practically impossible to leave unscanned a region of the semiconductor wafer within the surface to be patterned of the semiconductor wafer.

Furthermore, semiconductor wafers with which automatic devices fail can be scanned with this scanning device.

Other features which are considered as characteristic for the invention are set forth in the appended claims.

Although the invention is illustrated and described herein as embodied in a scanning device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
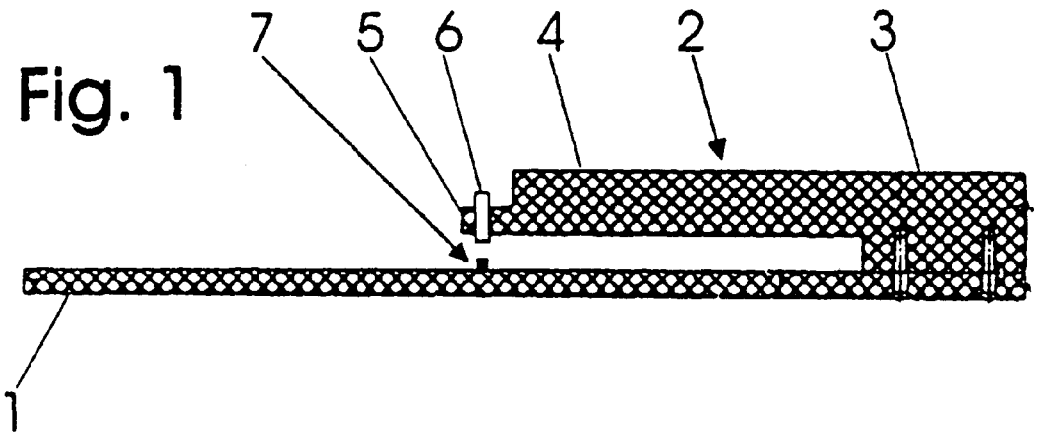
FIG. 1 is a diagrammatic, side, sectional view of a scanning device with an extension arm mounted on a base plate according to the invention.
Figure 2:
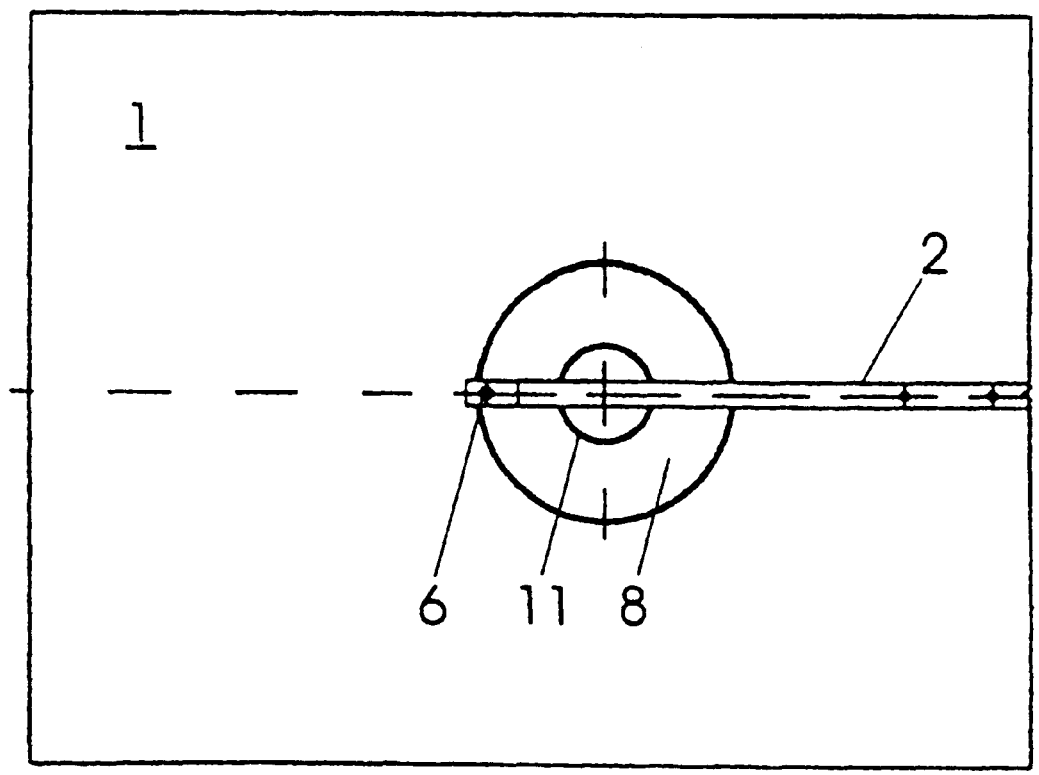
FIG. 2 is a plan view of the scanning device according to FIG. 1, with a depositing plate resting on the base plate and intended for a semiconductor wafer.

In all the figures of the drawing, sub-features and integral parts that correspond to one another bear the same reference symbol in each case. Referring now to the figures of the drawing in detail and first, particularly, to FIGS. 1 and 2 thereof, there is shown a scanning device according to the invention which contains a base plate 1. On the base plate 1, an extension arm 2 is fastened in such a way that it rests with a base 3 on an edge of the base plate 1 and reaches with its free arm 4 at a predetermined distance over to a center of the base plate 1. Provided at an end of the arm 4 that is located over the center of the base plate 1 is a receptacle 5 for a scanning tube 6. The scanning tube 6 is aligned exactly vertically and is located centrally over a guiding pin 7, which protrudes from the base plate 1. The distance between the base plate 1 and the extension arm 2 is chosen such that a depositing plate 8 with a semiconductor wafer 9 resting on it in a way corresponding to FIGS. 3–5 can be pushed in between. The scanning tube 6 is aligned in the receptacle 5 in such a way that it rests directly on the semiconductor wafer 9, or ends a small distance above the latter.

The scanning tube 6, which is produced from a hydrophobic material, serves for receiving a liquid drop, which has to be guided over a surface of the semiconductor wafer 9 for scanning the latter, as still to be explained.

Figure 5:
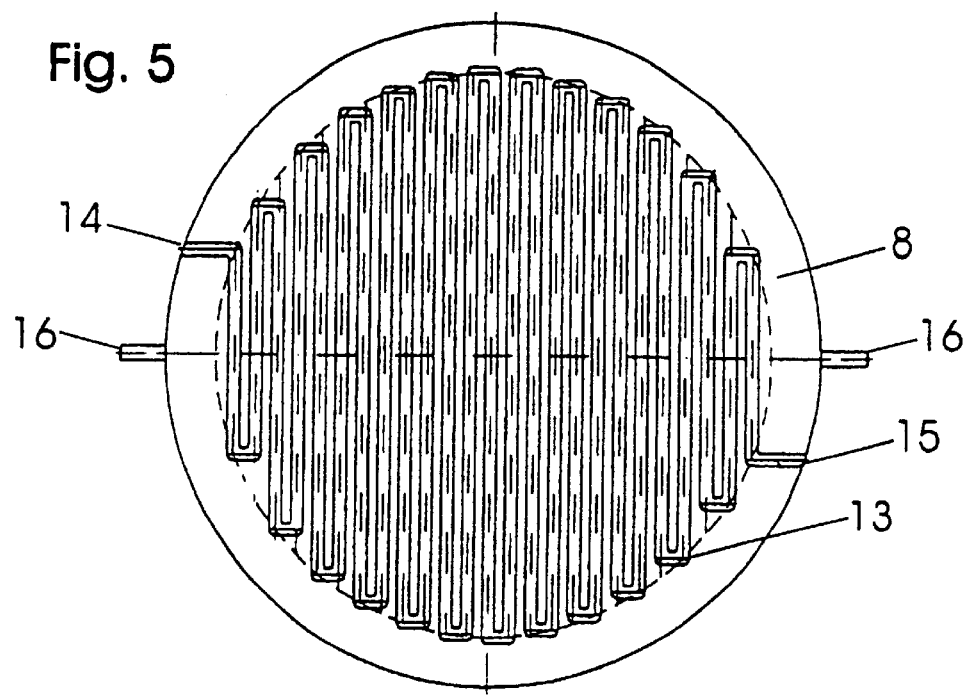
FIG. 5 is a plan view of the depositing plate as shown in FIG. 3 and from below.
Figure 4:
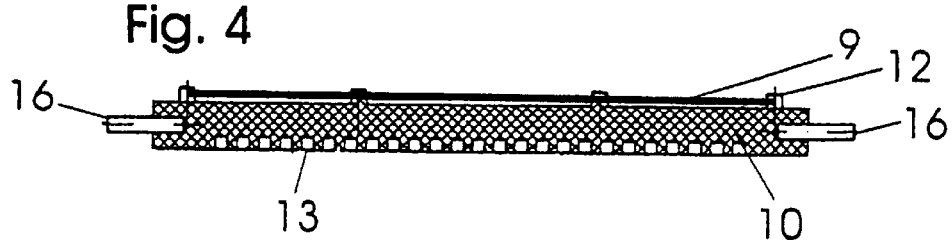
FIG. 4 is a sectional view of the depositing plate.
Figure 3:
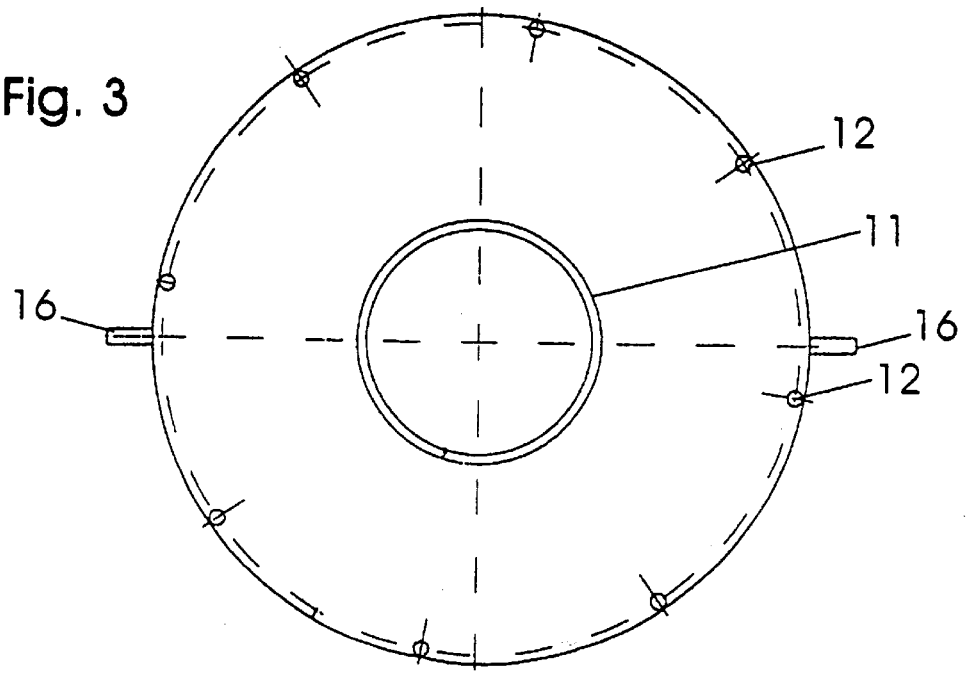
FIG. 3 is a plan view of the depositing plate.

The depositing plate 8, produced from a plastic, includes a basic body 10 of circular cross section (see FIGS. 3–5). From an upper side of which there protrudes a supporting ring 11, which is aligned concentrically with respect to the center of the depositing plate 8 and is intended for receiving the semiconductor wafer 9. The height of the supporting ring 11 is dimensioned in this case such that a suction pipette, absolutely necessary for handling the semiconductor wafers 9, can be pushed between the semiconductor wafer 9 and a basic body 10.

For a positional fixing of the semiconductor wafer 9 on the depositing plate 8, there are a plurality of centering pins 12, which protrude in a concentrically distributed manner around a circumference of an upper part of the depositing plate 8 in such a way that the semiconductor wafer 9 resting on the supporting ring 11 is centrally fixed.

The scanning of the semiconductor wafer 9 usually takes place by a liquid drop being guided over the entire surface of the semiconductor wafer 9, which essentially corresponds to the surface area to be patterned. In the case of the scanning device according to the invention, this takes place by the depositing plate 8 with the semiconductor wafer 9 placed on it being pushed under the extension arm 2 and by the liquid drop being filled into the scanning tube 6. The semiconductor wafer 9 is subsequently moved with respect to the scanning tube 6 in such a way that the liquid drop is guided essentially over the entire surface of the semiconductor wafer 9.

In order to improve and simplify this operation decisively, a meandering channel 13 or groove, which extends over a surface area corresponding to the surface area to be scanned on the semiconductor wafer 9, is made on an underside of the depositing plate 8 (FIG. 5). A beginning 14 and an end 15 of the channel 13 are in this case respectively taken laterally up to the edge of the depositing plate 8, with the result that the depositing plate 8 can be pushed laterally onto the centering pin 12.

In conjunction with the guiding pin 7, the depositing plate 8 can then be displaced in a way corresponding to the meandering channel 13 in a meandering manner under the scanning tube 6, with the result that the liquid drop held by the scanning tube 6 is guided over the surface of the semiconductor wafer 9. Instead of the meandering channel 13, a channel 13 disposed in a spiral-shaped manner may also be provided. What is essential in any case is that the distance between the respectively neighboring channels 13 is chosen such that the paths of the drop on the semiconductor wafer 9 slightly overlap, so that it is ensured that the surface is scanned with complete coverage. In the event that the liquid drop is entirely or partially lost during scanning, it can be simply collected again by briefly scanning backward.

In order to improve the guiding of the depositing plate 8 further, pins 16 protruding laterally from the latter are provided as gripping elements.

We claim:

1. A scanning device for performing part of a surface analysis of semiconductor wafers, comprising:

a base plate;

a depositing plate resting displaceably on said base plate, said depositing plate provided for receiving a semiconductor wafer having a surface; and a scanning tube disposed on said base plate such that the surface of the semiconductor wafer can be positioned directly under said scanning tube;

wherein a liquid drop from said scanning tube is positionable on the surface of the semiconductor wafer and the semiconductor wafer and the liquid drop are movable in relation to each other so that a concentration of metal and dopant traces from the semiconductor wafer are trapped in the liquid drop; and the semiconductor wafer can be moved in a horizontal direction in one of a meandering and spiral-shaped manner with respect to the liquid drop held in said scanning tube.

2. The scanning device according to claim 1, wherein the semiconductor wafer is aligned horizontally on said depositing plate.

3. The scanning device according to claim 1, wherein said scanning tube is formed of a plastic with hydrophobic properties.

4. The scanning device according to claim 1, including an extension arm securely connected to said base plate and reaching over said depositing plate with the semiconductor wafer resting on it, and said scanning tube fastened on said extension arm.

5. The scanning device according to claim 1, including a stationary guiding element disposed on said base plate, said depositing plate has a lower side, remote from the semiconductor wafer, with one of a meandering-shaped guide and a spiral-shaped guide formed therein corresponding to an intended path of movement of the liquid drop on the surface of the semiconductor wafer and receiving said stationary guiding element.

6. The scanning device according to claim 5, wherein said one of said meandering-shaped guide and said spiral-shaped guide extends over a surface area on said depositing plate which corresponds at least to the surface to be patterned of the semiconductor wafer.

7. The scanning device according to claim 5, wherein said one of said meandering-shaped guide and said spiral-shaped guide is a channel and said stationary guiding element is a guiding pin protruding from said base plate and entering into said channel, said guiding pin being in alignment with said scanning tube.

8. A scanning device for performing part of a surface analysis of semiconductor wafers, comprising:

a base plate;

a guide pin disposed on and protruding from said base plate;

a depositing plate resting displacably on said base plate and for receiving a semiconductor wafer having a surface, said depositing plate having an underside with guiding channels formed therein for receiving and guiding said guiding pin; and a scanning tube disposed on said base plate from which a liquid drop is held and guided on the surface of the semiconductor wafer and the semiconductor wafer and the liquid drop are movable in relation to each other so that a concentration of metal and dopant traces from the semiconductor wafer are trapped in the liquid drop.

9. The scanning device according to claim 8, wherein said scanning tube is fixed in place on said base plate positioned over the semiconductor wafer, the semiconductor wafer being displaceable in one of a meandering and spiral-shaped manner.

10. The scanning device according to claim 8, wherein said scanning tube is fixed in place on said base plate positioned over the semiconductor wafer, the semiconductor wafer being displaceable in at least one of a meandering manner, a spiral-shaped manner, and a rotatable manner.

11. The scanning device according to claim 8, wherein said scanning tube is displaceable with respect to the semiconductor wafer.

* * * * *